United States Patent [19]

Harshbarger et al.

[11] 4,208,241

[45] Jun. 17, 1980

[54] DEVICE FABRICATION BY PLASMA ETCHING

[75] Inventors: William R. Harshbarger, Bethlehem, Pa.; Hyman J. Levinstein; Cyril J. Mogab, both of Berkeley Heights, N.J.; Roy A. Porter, Whitehall, Pa.

[73] Assignee: Bell Telephone Laboratories, Incorporated, Murray Hill, N.J.

[21] Appl. No.: 929,549

[22] Filed: Jul. 31, 1978

[51] Int. Cl.$^2$ .......................................... H01L 21/306
[52] U.S. Cl. ................................. 156/643; 156/646; 156/656; 156/657; 156/662; 204/192 E; 252/79.1
[58] Field of Search .............. 156/643, 646, 656, 657, 156/659, 662, 665, 667; 204/192 EC, 192 E, 164, 298; 252/79.1; 250/492

[56] References Cited

U.S. PATENT DOCUMENTS

| | | | |
|---|---|---|---|
| 3,940,506 | 2/1976 | Heinecke | 427/38 |
| 4,030,967 | 6/1977 | Ingrey et al. | 156/646 X |
| 4,069,096 | 1/1978 | Reinberg et al. | 156/643 |
| 4,101,411 | 7/1978 | Suzuki et al. | 204/298 |

Primary Examiner—William A. Powell
Attorney, Agent, or Firm—George S. Indig

[57] ABSTRACT

High density fine-line integrated structure fabrication is expedited by use of plasma etching systems which assure straight vertical walls (absence of undercutting). Critical to the sytems is choice of appropriate plasma chemistry. Appropriate systems are characterized by inclusion of recombination centers, as well as active etchant species. Recombination centers which effectively terminate etchant species lifetime in the immediate vicinity of resist walls afford means for controlling etching anisotropy. Use is foreseen in large scale integrated circuitry (LSI) and is expected to be of particular interest for extremely fine design rules, i.e., in Very Large Scale Integrated circuitry.

26 Claims, No Drawings

DEVICE FABRICATION BY PLASMA ETCHING

BACKGROUND OF THE INVENTION

A. Technical Field

Fabrication procedures in accordance with the application are applicable to high density fine resolution integrated circuitry, as well as discrete devices. The technology of primary consequence at this time is that based on silicon. Other areas of consequence include those based on other semiconductor technology, as well as magnetism, integrated optics, etc.

B. History

Large Scale Integrated circuitry based on silicon technology is exemplary of high device density circuits produced lithographically. Circuits, as well as discrete devices, related from a fabrication standpoint are based on other semiconductor technology. Other fields of interest include magnetic circuitry, e.g., bubble memory, integrated optics, etc. Since silicon LSI fabrication is exemplary of the inventive teaching discussion is in such terms.

At this time, patterning is on discrete masks with such masks serving in the replication of patterns in radiation sensitive layers (resist layers) on the structure in fabrication. The trend toward increased miniaturization (from the now common design rule of about 4 microns ultimately to submicron) is resulting in changes in fabrication techniques. For example, largely due to registration problems, interest is growing in a maskless approach known as direct processing. In direct processing resist layers on the wafers themselves are primary pattern delineated and thereafter serve as disposable masking layers.

Masking layers, whether produced through primary or secondary patterning serve to delineate underlying material through a wide diversity of successive processing steps. A procedure of particular consequence involves etching to produce patterned layers of materials such as silicon—monocrystalline as well as polycrystalline, silicon oxide, silicon nitride (sometimes plasma deposited, sometimes pyrolytically deposited), etc.

Present design rules are such that adequate feature resolution may be attained by use of wet processing, e.g., chemical etching. The need for closer feature spacing gives rise to a concomitant need for closely controlled etch profiles (generally straight vertical etch walls without significant undercutting beneath masking resist edges).

Need for anisotropic etching has been satisfied through high energy dry processes such as ion milling, sputtering and the like. Such procedures, however, while satisfactory for many purposes complicate fabrication by radiation damage, rapid resist erosion and other effects due to bombardment. Plasma etching processes offer advantages of dry processing but do not always result in controllable anisotropic etching. While vertical walls may sometimes be approached by appropriate choice of plasma conditions (use of low pressure and other conditions introducing directionality) radiation damage may again be a problem.

SUMMARY OF THE INVENTION

Fabrication of devices and circuitry takes advantage of plasma etching procedures affording flexibility in etch profile. Systems are sufficiently flexible to result in vertical walls or other desired profiles. A variety of plasma power-pressure conditions preferred embodiments permit selection of reactor conditions which minimize damage due to secondary x-ray emission attributed to energetic electrons.

In terms of the usual preference for vertical etch walls, undercutting is controlled. Etching of side walls underlying resist layers is controlled by providing recombination sites for active etchant species in the vicinity of such walls.

Etching in accordance with the invention proceeds from species resulting from introduction of an appropriate gas composition into the plasma. The gas composition may be considered as containing distinct species which, in the plasma, yield (a) predominant effective etchant species and (b) recombinant. While conveniently so identified, either of these two plasma species may be inchoate—may rely upon surface state or other reactions for their functions.

It is a significant part of the inventive teaching that separately identifiable reactants implicitly permit the variation in relative amounts of such reactants. Variation in the reactant ratio resulting in variation in the etchant-recombinant ratio permits tailoring of etchant profile. In preferred embodiments, straight vertical walls (or other desired profiles) may be produced for a vast variety of processing conditions by variation of this ratio.

DETAILED DESCRIPTION

1. General

The inventive subject matter is concerned with fabrication of articles such as circuits and discrete devices involving one or more plasma etching procedures. Necessary preceding lithographic procedures may be by replication by a discrete mask or may be by a maskless route—i.e., by direct processing. In either event, articles undergoing processing are, at the relevant stage/s, provided with an adherent resist layer which is pattern delineated (1) by actinic radiation which alters solubility, and (2) by development in a solvent, to selectively remove either exposed regions or, unexposed regions dependng on whether resist is positive or negative acting. In certain procedural variants "resist" may not, itself, be patterned by actinic radiation but may be patterned directly or indirectly by replication from some overlying radiation-sensitive pattern delineated material.

Relevant processing, in accordance with the invention, necessarily implies selective plasma etching of bared substrate underlying patterned resist. Materials encountered—materials to be etched—vary in accordance with the article undergoing processing. In the commercially significant instance of LSI, materials encountered at this time include, silicon (either monocrystalline or polycrystalline), silicon oxide (doped or undoped) silicon nitride (plasma or pyrolytically deposited) as well as resists, themselves, (removal of which may involve "lift-off" of overlying material, etc. Depending upon the technology—semiconductor optics, magnetics, etc., other materials may be encountered. Examples include boron nitride, permalloy, substituted yttrium iron garnet, lithium niobate, lithium tantalate, etc.

The inventive processes are of prime significance as involved in fabrication of fine line devices or circuits. At this time, state of the art Large Scale Integrated silicon circuitry follows design rules of about 4 microns. Use of plasma etching is common in the fabrication of such LSI's.

Increasing miniaturization with concomitant decrease in design rules to the micron and the submicron regions will likely result in increasing use of plasma etching. Reduction in design rules results in imposition of further demands on etch profiles, generally in the direction of vertical edges with minimal undercutting.

The above desiderata are realized by use of etching systems resulting from introduction of gaseous reactant which may be regarded as a mixture of two or more component-yielding constituents. Introduction of such reactant into the plasma yields two species—(1) a predominant effective etchant species and (2) a recombinant.

The nature of the recombinant is such as to result in recombination of the predominant species at or in the vicinity of etch walls to provide a vehicle for controlling degree of etch attack of the walls.

A significant characteristic of the inventive processes depends upon the observation that the amount of recombinant as well as etchant is finite. Adjustment of quantity of the one relative to the other permits a degree of control which may result in vertical, flat etch walls, or for that matter, in walls which show some controllable degree of undercutting. It is even possible under conditions which prefer recombinant to etchant, to produce walls which evidence "negative undercutting" (in which the etched walls protrude beyond the mask edge into the unmasked region).

2. Definitions

It is convenient for expository purposes to define terms; some in prevalent usage, some peculiar to the inventive teaching.

Plasma Etching: Etching which proceeds primarily by virtue of conditions created within a plasma. The definition encompasses a number of procedures, conventionally designated in specific terms—e.g., reactive ion etching, sputter etching, etc. From the inventive standpoint, concerned procedures are at sufficiently low power and sufficiently high pressure that etching is primarily dependent upon chemical reaction at the surface being etched. The term, plasma etching, is intended to exclude procedures in which the predominant removal mechanism involves momentum transfer—i.e., the invention is not concerned, inter alia, with ion milling.

Resist: The term is used in the sense of its implicit meaning—i.e., to define material overlying substrate to be etched wherein the resist limits attack of underlying material by reactant—in these instances, by etchant. In keeping with common usage, it is not required that the resist either in its original or patterned form be radiation sensitive. Accordingly, the term includes overlying material which may, itself, be pattern delineated by corresponding radiation and subsequent development, as well as overlying material which is not and was never radiation sensitive but which may be pattern delineated by other means. In general, as used in this description, resist is patterned since it is most relevant at edge regions defining demarcation between material to be retained and material to be removed during etching. Reactant has reference to material as introduced into the plasma. This material, normally gaseous, may be regarded as a gaseous mixture containing at least two reactant components: (1) reactant etchant component and (2) reactant recombinant component. Such reactant, normally neutral (uncharged), may include elemental, diatomic and/or chemically combined species. While the two named reactant components are of prime significance from the standpoint of the invention, other material may be introduced. Additional material may serve as carrier, diluent, etc.

Active Components: These are components present in the plasma responsible for the two functions of primary concern to the teaching:

Etchant Species: Species which, through chemical reaction with the surface being etched, is/are primarily responsible for material removal. For many purposes, the discussion is in terms of the predominant etchant species; and Recombinant: Recombination centers responsible for terminating the effective lifetime of the predominant etchant species. Inventive conditions are so chosen that recombinant is effective in inactivating (or at least significantly reducing activity of) predominant etchant species at or in the vicinity of etch walls.

Etch Profile: Wall configuration produced in material being etched. Generally, the term refers to such profile at or subsequent to etching. Profiles encountered Vertical—essentially flat etch walls on a plane common with the defining overlying resist edge and normal to the substrate surface. While some resist edge etching may occur, it is desirably minimized so that the plane is in a position approximating that of the resist edge prior to etching;

Undercut: Etched wall, some portion of which—generally, the upper portion of which—"undercuts", that is, lies under resist;

Negative Undercut: Defines edge configurations produced during etching wherein continuing etching is effective on diminishing area so that the bottom plane of the etched region is smaller than the feature defined by the corresponding resist aperture.

Isotropic Etching: Refers to a random etching process with etching proceeding at a uniform rate in all directions (both vertically and laterally). Isotropic etching, therefore, results in undercutting, but a specified undercutting in which the etched region closest to the resist undercuts to a dimension approximately equal to that of the vertical etch dimension. Isotropic etching is independent of undercutting due to overetching (which may result during anisotropic etching).

Anisotropic Etching: Etching which results from some directionality causing divergence from isotropic etching. In this sense, undercutting, whether negative or positive, may be anisotropic so long as etching proceeds unequally in two directions—e.g., vertically and laterally. Ideal anisotropic etching refers to etching resulting in an essentially flat, vertical etch wall on a plane approximately that of the initial resist edge prior to etching.

3. Reactant Composition

The general nature of the reactant composition is indicated under the preceding section heading. Exemplary systems generally rely upon a halogen-derived active etchant species—this on the basis of mass spectroscopic analysis of effluent. Such species likely atomic halogen—e.g., chlorine or bromine—is introduced in combined form in the reactant. In the instance of atomic chlorine predominant species introduction may be in the form of $Cl_2$, $CF_3Cl$, etc. Reactant is usually gaseous, and to prevent possible condensation, all introduced matter is desirably gaseous at room or near room temperature. Recombinant reactant is, in the instance of silicon etching, likely a fluorocarbon. Examples are $C_2F_6$ and $CF_3Cl$. For etchant systems and conditions, operative to yield useful etch rates, it is a general requirement that recombinant be relatively inactive as an etchant species with respect to materials in the article undergoing processing. While fluorocarbon radicals are sufficiently inactive as regards silicon, as well as overlying resists, it is generally not suitable for certain other materials, for example, aluminum. In an example herein, recombinant effective for aluminum etching derives from the recombinant reactant, $BCl_3$.

Relative amounts of the two operative components are determined so as to result in the desired etch profile. Conditions of concern discussed in detail in a subsequent section are resist edge surface area and other conditions determinative of recombinant quantity as well as predominant etchant. The latter, largely determined on the basis of the nature of the predominant etchant species itself is influenced as well by other parameters including power, pressure, etc. Under many conditions, recombinant component introduced exceeds etchant component by a factor of two or more for ideal anisotropic etching (ratios here are generally molar). Accordingly, $CF_3Cl$, which may be treated as a 1:1 molar mixture of recombinant reactant, etchant reactant is not appropriate at least for ideal anisotropic etching in accordance with the invention. Predominant etchant species resulting from this 1:1 mixture results in a degree of undercutting generally excessive for contemplated use under preferred etching conditions.

The inventive teaching affords flexibility in profile tailoring resulting from specification of the component ratio. $CF_3Cl$ may be introduced together with recombinant reactant, $C_2F_6$, to result in an etch profile generally suitable for fabrication. For the exemplary system $C_2F_6$—$Cl_2$ 5 to 14 volume percent $Cl_2$ results both in expedient etching and, under other conditions prescribed herein, in profiles either ideally anisotropic or otherwise suitable for most purposes. While the effective reactant species may be more complex it is convenient to consider them in terms of the presumed predominant etchant species Cl, and the recombinant $CF_3$. In these terms and on the assumption of proportional plasma activation a formula unit ratio of from 2 to 14 percent may result both in effective etching and ideal or otherwise desired anisotropy under most conditions. In view of the fact that selectivity (e.g., for silicon relative to $SiO_2$, increases with increasing introduced $Cl_2$ a useable ratio may exceed 14 percent, may attain a level as high as 90 percent or even greater where spacing is sufficient so that the resultant undercutting may be tolerated.

Another system used in the example is the related halogen system dependent upon introduction of combined bromine. Ratio ranges for this system are similar to those discussed for the analogous chlorine system. Another system set forth in the examples involves introduction of $BCl_3$—$Cl_2$. Here it is convenient to consider the predominant etchant species to be atomic chlorine and the recombinant species to be derived from $BCl_3$—possibly $BCl_2$. Ratio ranges in terms of $Cl:BCl_2$ are from 0.1 to 5 percent resulting in ideal anisotropic etching or other desired anisotropic etching under most contemplated conditions.

A final note—most embodiments of the invention are dependent upon introduction of identifiable recombinant reactant and etchant reactant. In general, the reactant is a gaseous mixture, so permitting variation in ratio of the two reactant materials. This flexibility is of extreme significance is that it permits tailoring of profile either to ideal anisotropy or other desired slope under a variety of processing conditions. The most significant processing conditions, it has been indicated, are those which include sufficiently high pressure, low power to permit operation with minimal effects attributable to momentum transfer.

It is nevertheless true that relatively unusual circumstances may permit (1) reactant—recombinant species chemically combined in a single compound to result in fixed ratio and even (2) etchant species—recombinant species—attributable to a single precursor reactant. The former, of which $CF_3Cl$ is a prime example, generally results in a degree of undercutting unacceptable for most purposes but tolerable for large feature spacing. Some compound reactants may inherently provide for a ratio which results in more nearly ideal anisotropy. The latter has been found to yield useful profiles only where etch rate is relatively low under usually preferred etching conditions. This last observation is considered inherent since useful profiles are in accordance with the inventive teaching, the result of the balance between etching and recombination.

4. Effective Recombinant Species

An extensive series of experiments suggest profile control to be due to a combination of the factors (a) physical state of the resist edge surface (or more generally of the entire edge surface including bared material as etching proceeds), (b) chemical nature of edge surface, and (c) the nature of the species likely produced by the plasma as introduced into the vicinity of the wall. It is indicated that the number of effective recombinant species units is finite—a conclusion explainable in terms of saturation or near saturation of available reactive sites on the resist portion of the walled surface. Variation of surface smoothness results in the expected need for a corresponding variation in predominant etchant species confirming the saturation premise.

The large disparity in chemical and physical nature of the variety of resists found effective for providing recombination sites leads to the conclusion, again consistent with prior knowledge, that any organic composition suitable for use as a resist may serve (any hydrocarbon-based polymer provides surface for recombination but must be reasonably stable in the plasma environment to serve as a resist). Conducted experiments include novolacs of a variety of molecular weights and compositions, as well as, different degrees of crosslinking. A large variety of other resists—negative as well as positive acting—were found as effective as the prevalently used novolac positives. Variations in surface smoothness resulted, inter alia, from differing pre-etch bake conditions, as well as, differing resist-delineating etchants.

Other experimental results are supportive of competing recombination-etching reactions in the vicinity of the wall. For example, inclusion of recombinant species with significant resist etching activity affords little profile control even though resulting in short inherent etchant species lifetimes. While it is appropriate to consider final recombinant as existing within the bulk of the plasma, activity at the wall is consistent with recombinant species initiated at that position.

It is clear from experimental results and it is in fact a thesis upon which the invention is based, that recombinant at least initially at the resist surface influences etch profile of the (non-resist) material being etched. A rule of conduct necessarily yielding the inventive results is defined in terms of resist-recombinant pair provided only that recombinant is not consumed by other surface material on the wall. Accordingly, while profile control is continued independent of etch depth in silicon (for the nominal $CF_3$ recombinant), an intermediate layer of $SiO_2$ interferes with profile control. This is consistent with the known reactivity of $SiO_2$ and $CF_3$.

5. Effective Etchant Species

Stated simply the invention depends upon a competition between etching and recombination. Etchant is properly considered only in terms of amount relative to recombinant—a parameter which as indicated is intimately related to a number of factors such as resist surface. On the assumption that resist wall surface is generally at a near saturated level with respect to recombinant, it is reasonable to consider the recombinant level as fixed, and to alter the effective concentration of etchant. Ideal anisotropic etching defines that balance most desirable for high circuit density. Deviating in the direction of increased etchant results in undercutting: deviating in the direction of less etchant may result in negative undercutting (depending upon the etchant activity of recombinant or other species present). In the instance of etchants, showing significant selectivity for material being etched relative to underlying material, negative undercutting, to the extent undesired, may be "corrected" by etching for a sufficient period after clearing.

6. Processing Conditions

To the person familiar with the field the inventive teaching is sufficiently expressed in terms of the observation that variation of etchant:recombinant ratio results in profile control. The inventive thrust is increased anisotropy consistent with reasonable etch rates and other desired etching conditions. Precise specification for production use may be determined by experimental runs in which the various parameters are altered.

It is convenient for expository purposes to briefly describe plasma etching conditions as normally encountered in reactor designs in present use. For a variety of reasons, parallel plate reactors are gaining in favor in the industry. Advanced designs assure flow patterns resulting in reasonable wafer-to-wafer etching uniformity. See for example A. R. Reinberg in "Etching for Pattern Definition" (H. G. Hughes and M. J. Rand, eds.), The Electrochemical Society, Inc. Princeton, N.J., 1976; and R. G. Poulsen, *J. Vac. Sci. Technol.*, 14, 266, (1977).

Parallel plate systems comprise pairs of plates contained in a suitable vacuum enclosure. Power, commonly in rf range (e.g., 13.56 megahertz), is applied to the driven plate to initiate and sustain a discharge between the plates, the nondriven of which is ordinarily held at ground potential. It has been indicated that "plasma etching" as here contemplated may include a variety of procedures commonly designated otherwise. The only requirememt for these purposes is primary removal of surface material to be etched through chemical reaction rather than momentum exchange with plasma derived active etchant species. Nomenclature variations may arise, for example, in accordance with relative size of electrodes, as well as, placement of the wafers (either on the driven or nondriven electrode/s). In the procedure commonly known as reactive ion etching, the driven electrode is substantially smaller than the counter electrode and the material to be etched is placed on the driven electrode. In the case of the procedure ordinarily referred to as plasma etching the electrodes are more nearly symmetric and the material to be etched is placed on the nondriven electrode. Such apparatus variations, as well as variation among the conditions: power, pressure, etc. qualify in accordance with the teaching provided the fundamental requirement (primary removal by chemical reaction . . . ) is met.

Parameters subject to control in these reactors are: etch gas composition, pressure, inlet flow rate, power, interelectrode spacing and substrate temperature. Typical ranges for these parameters are: pressure—$10^3$ -2.0 Torr; flow rate—10-500 SCCM; power—100-3000 watts; electrode spacing—5-50 millimeters; diameter—17 inches; electrode substrate temperature—25-250 degrees C.

Desired plasma etching conditions considered to represent preferred usage are discussed. Discussion is generally in terms of apparatus available at this time. It is quite likely that improved apparatus design will have its expected effect. Accordingly, the following discussion, while meaningful in terms of present practice, may not be limiting particularly in accordance with future practice.

In reactor designs, it is significant that inventive processes may provide for desired profiles at plasma pressures of the order of 0.1 torr. This is in contradistinction to many prior art processes in which ideal anisotropic etching was accomplished only at lower pressure. This pressure value is the approximate demarcation between viscous flow (for higher pressures and nonviscous atomic, ionic or molecular flow at lower pressures. Viscous flow designates the condition under which collision is more likely within the plasma than between the plasma and a solid surface. It accordingly designates, for typical plasma power density, the threshold condition, below which substantial radiation damage may result.

Plasma powers of several watts per cubic centimeter are available. Powers substantially above 1 watt/$cm^3$ cause nonuniformity problems and plasma stability is difficult to maintain at pressures of the order of 1.0 torr and above.

A third parameter, inter-related with the first two, is etch rate. From a commercial standpoint, this is a significant factor sometimes determinative of throughput. It is significant too in that slower etching necessarily implies longer periods of resist exposure. Depending upon the thickness of the layer to be etched, resist erosion, normally at a significant level, may become limiting. For many lithographic processes, practical resist thicknesses do not greatly exceed mean dimensions to be defined. It is reasonable to set a minimum value on etch rate at 300 Angstroms/min. or preferably at 500 Angstoms/min. Etchant discrimination as between usual materials to be etched, and the more durable of the polymeric resists, is generally sufficient to permit retention of an effective fraction of resist for such rates. For relatively thick layers to be etched—layers on the order of microns—the above considerations give rise to a preference for etch rates substantially above 500 Angstroms/min.

7. Examples

Examples are set forth in tabular form. The inventive teaching is best described in terms of variation in the ratio—predominant effective etchant species: effective recombinant species—and accordingly, examples chosen for inclusion in the table were conducted in the same apparatus under substantially identical conditions with only the operative ratio being varied. Table 1, exemplary of halogen based systems, relates to etching of so-called "polysilicon" (polycrystalline silicon—in this instance phosphorus-doped to a resistivity level of $5\times10^{-3}$ Ω-cm). The resist in each instance is the same commercially available quinone diazide-sensitized, positive working novolac. Results have, as indicated, been confirmed with many other systems, including a large variety of other resist systems.

The system used in each of the examples set forth in Table 1 is based on introduction of $C_2F_6$—$Cl_2$. It is particularly useful in that reactant is a simple two component gaseous mixture with one component yielding effective recombinant species, and the other yielding primary effective etchant species. Similar results may be obtained for example with $CF_3Cl \times C_2F_6$ but the relationship between reactant and effective species is less direct. Reactant conditions for each of the examples were 400 watts plasma power, 0.35 torr pressure, 30 mm electrode spacing, 25 degrees C. platen temperature (temperature of the lower grounded electrode serving as support for matter to be etched), 175 SCCM flow rate (standard cu. cm/min.—"standardized" at 25 degrees C.).

| Ex | % $Cl_2$ | Profile | Etch Rate (Angstroms/Min.) | Selectivity* |
|---|---|---|---|---|
| 1** | 0 | Anisotropic | 20 | 1:5 |
| 2 | 7.5 | Anisotropic | 530 | 5.9:1 |
| 3 | 10 | Anisotropic | 600 | 6.7:1 |
| 4 | 12 | Anisotropic | 760 | 8.4:1 |
| 5 | 13.8 | Anisotropic | 800 | 8.9:1 |
| 6 | 19.4 | undercut | 1240 | 13.8:1 |
| 7 | 25.9 | isotropic | 1700 | 19:1 |

*Etch rate ratio Polysilicon: Silicon dioxide
**Example 1 is included to illustrate the extreme recombinant/etchant ratio. It does not represent a preferred embodiment of the invention from the standpoints of etch rate--in this instance regarding selectivity.

In addition to the tabulated examples, other experiments under the same conditions, but with still larger chlorine content were conducted. The trend continued so that etching was isotropic through 90 percent $Cl_2$ with etch rate and selectivity both increasing.

A variety of experiments have shown similar effects on other systems. So, for example, varying the relative amounts of $BCl_3$—$Cl_2$ resulted in the same general trend in profile. Whereas a specific ratio resulted in ideal anisotropic etching of aluminum-rich alloy, increase in $Cl_2$ caused behavior to approach isotropic.

We claim:

1. Process for fabrication of an article comprising at least one operation during which the article undergoing fabrication comprises a surface of material to be etched within selective regions, during which operation the article undergoing fabrication includes an overlying process layer with apertures corresponding with the said regions, wherein the said article is maintained within a plasma environment contained within an apparatus, the plasma resulting from imposition of an electrical field across a gaseous mixture between two electrodes, the said plasma being characterized by an electrical power and a total pressure, etching being primarily due to chemical reaction with the said material to be etched, etching being sufficiently selective to remove a desired thickness below the said article surface while retaining sufficient thickness of processing layer to prevent substantial attack of the surface below portions of the said processing layer which are not apertured, characterized in that the said gaseous mixture yields chemically distinct identifiable species derived from the said gaseous mixture, said mixture comprising two gaseous reactants corresponding with a first effective species denoted primary etchant species and a second species denoted effective recombinant species, the said recombinant species combining with the said primary effective etchant species in the vicinity of processing material at apertures, thereby lessening the lateral etch rate relative to the vertical etch rate of surface being etched, in which the said pressure is sufficient to prevent significant radiation damage to the said article surface and in which the ratio of the said two gaseous reactants is set to result in etching which is substantially ideally anisotropic.

2. Process of claim 1 in which the said pressure is at least about 0.1 torr and in which the etch rate is a dimension normal to the said article surface is at least 300 Angstroms/min.

3. Process of claim 2 in which the said etch rate is at least 500 Angstroms/min.

4. Process of claims 1, 2, or 3 in which the said power does not exceed about 3 watts/cm³.

5. Process of claim 4 in which the said power is at a maximum 1 watt/cm³.

6. Process of claim 5 in which the said article surface is the surface of a supported layer and in which etching is continued for a time sufficient to penetrate the said layer.

7. The process of claim 6 in which the said processing layer comprises an organic polymeric material.

8. Process of claim 7 in which the said organic polymer material is the aperture, pattern-delineated product of an actinic, radiation-sensitive resist.

9. Process of claim 8 in which the said article surface comprises electrical silicon.

10. Process of claim 9 in which the said article surface is polycrystalline.

11. Process of claim 9 in which the said effective recombinant species includes a halocarbon.

12. Process of claim 11 in which the said halocarbon is a fluorocarbon.

13. Process of claim 12 in which the said primary effective etchant species is derived from halogen.

14. Process of claim 13 in which the said halogen is chlorine.

15. Process of claim 14 in which the said gaseous mixture comprises a halide of a fluorocarbon.

16. Process of claim 15 in which the said halide is $CF_3Cl$.

17. Process of claim 14 in which the said gaseous mixture comprises a halogen-containing reactant and a chemically distinct fluorocarbon.

18. Process of claim 17 in which the said halogen containing reactant is diatomic chlorine.

19. Process of claim 17 in which the said fluorocarbon $C_2F_6$.

20. Process of claim 14 in which the volume percent of chlorine expressed as atomic chlorine is from 5 to 14 based on a total atom content of Cl and C.

21. Process of claim 18 in which the said article surface is a layer of aluminum-rich material and in which the said gaseous mixture comprises a halogen containing reactant and a chemically distinct boron halide.

22. Process of claim 21 in which the said halogen containing reactant is diatomic chlorine and in which the boron halide is $BCl_3$.

23. Process of claim 1 in which the total pressure within the said plasma is at least about 0.1 torr.

24. Process of claim 23 in which the said maximum power is about 3 watt/cm$^3$.

25. Process of claim 24 in which the etch rate normal to the said article surface is at least about 500 Angstroms/min.

26. Process for fabrication of an article comprising at least one operation during which the article undergoing fabrication comprises a surface of material to be etched within selective regions, during which operation the article undergoing fabrication includes an overlying process layer with apertures corresponding with the said regions, wherein the said article is maintained within a plasma environment contained within an apparatus, the plasma resulting from imposition to an electrical field across a gaseous mixture between two electrodes, the said plasma being characterized by an electrical power and a total pressure, etching being primarily due to chemical reaction and the said material to be etched, etching being sufficiently selective to remove a desired thickness below the said article surface while retaining sufficient thickness of processing layer to prevent substantial attack of the surface below portions of the said processing layer which are not apertured, characterized in that the said gaseous mixture yields a first effective species denoted primary etchant species and a second species denoted effective recombinant species, a said species being derived from a fluorocarbon gaseous reactant, the said recombinant species combining with the same primary effective etchant species in the vicinity of processing material at apertures, thereby lessening the lateral etch rate relative to the vertical etch rate of surface being etched, in which the said pressure is sufficient to prevent significant radiation damage to the said article surface and in which the composition of the said gaseous mixture is set so as to result in an etch profile divergent from isotropy at least to the extent that etch rate parallel to the said article surface differs by ten percent from the normal to the said article surface.

* * * * *

UNITED STATES PATENT AND TRADEMARK OFFICE
CERTIFICATE OF CORRECTION

PATENT NO. : 4,208,241

DATED : June 17, 1980

INVENTOR(S) : William R. Harshbarger, Hyman J. Levinstein, Cyril J. Mogab and Roy A. Porter It is certified that error appears in the above—identified patent and that said Letters Patent is hereby corrected as shown below:

Column 2, line 1 after "conditions" insert --of--.

Column 3, line 64 "Reactant" should start a new paragraph.

Column 5, line 52 "useable" should read --usable--.

Column 9, line 26 "x" should read --+--.

Column 10, line 45 "electrical" should read --elemental--.

Column 11, line 26 "to" should read --of--.

Signed and Sealed this

Twenty-eighth Day of October 1980

[SEAL]

Attest:

SIDNEY A. DIAMOND

Attesting Officer

Commissioner of Patents and Trademarks